United States Patent
Andreev et al.

(10) Patent No.: US 11,339,960 B2
(45) Date of Patent: May 24, 2022

(54) EMITTER INCLUDING A LED ELEMENT AND METHOD FOR EMITTING LIGHT BY MEANS OF AN EMITTER

(71) Applicant: Würth Elektronik eiSos GmbH & Co. KG, Waldenburg (DE)

(72) Inventors: Zhelio Andreev, Schwäbisch Hall (DE); Marcel Dörr, Ludwigsburg (DE); Klaus Richter, Abstatt (DE)

(73) Assignee: Würth Elektronik eiSos GmbH & Co. KG, Waldenburg (DE)

( * ) Notice: Subject to any disclaimer, the term of this patent is extended or adjusted under 35 U.S.C. 154(b) by 0 days.

(21) Appl. No.: 17/096,556

(22) Filed: Nov. 12, 2020

(65) Prior Publication Data

US 2021/0156553 A1 May 27, 2021

(30) Foreign Application Priority Data

Nov. 26, 2019 (DE) ..................... 10 2019 218 304.2

(51) Int. Cl.
| | |
|---|---|
| *F21V 29/56* | (2015.01) |
| *F21V 9/32* | (2018.01) |
| *G01N 15/06* | (2006.01) |
| *F21V 9/45* | (2018.01) |
| *F21V 9/38* | (2018.01) |
| *F21Y 115/10* | (2016.01) |

(52) U.S. Cl.
CPC ................ *F21V 29/56* (2015.01); *F21V 9/32* (2018.02); *F21V 9/38* (2018.02); *F21V 9/45* (2018.02); *G01N 15/06* (2013.01); *F21Y 2115/10* (2016.08); *G01N 2015/0687* (2013.01)

(58) Field of Classification Search
CPC ... F21V 29/56; F21V 9/32; F21V 9/38; F21V 9/45; G01N 15/06; G01N 2015/0687; F21Y 2115/10; H01L 25/0753; H01L 33/507; H01L 33/648

See application file for complete search history.

(56) References Cited

U.S. PATENT DOCUMENTS

| | | | | |
|---|---|---|---|---|
| 4,731,557 | A | * | 3/1988 | Asano .................... H01J 29/006 313/36 |
| 8,410,681 | B2 | * | 4/2013 | Shaikevitch .......... H01L 33/644 313/503 |
| 2016/0348857 | A1 | | 12/2016 | Miyata |

FOREIGN PATENT DOCUMENTS

| | | | |
|---|---|---|---|
| DE | 102011083698 A1 | | 4/2013 |
| JP | 2013023662 A | * | 2/2013 |
| WO | WO-2013023662 A1 | * | 2/2013 ................ F21V 9/35 |

OTHER PUBLICATIONS

Partial translation DE102011083698A1 and google translation of search report (Year: 2011).*

* cited by examiner

*Primary Examiner* — Tracie Y Green
(74) *Attorney, Agent, or Firm* — McGlew and Tuttle, P.C.

(57) ABSTRACT

An emitter, in particular a lamp, and a method for emitting light are described. The emitter comprises at least one LED element for producing electromagnetic radiation in a first frequency range and an active cooling unit for cooling the at least one LED element, having at least one cooling channel for a coolant. The at least one cooling channel is arranged at least partially in a beam path of the electromagnetic radiation produced by the at least one LED element. The coolant comprises at least one phosphor for converting at least a part of the electromagnetic radiation into light to be emitted in a second frequency range, which is different from the first frequency range.

16 Claims, 5 Drawing Sheets

EMITTER INCLUDING A LED ELEMENT AND METHOD FOR EMITTING LIGHT BY MEANS OF AN EMITTER

CROSS-REFERENCES TO RELATED APPLICATIONS

This application claims the priority of German Patent Application, Serial No. 10 2019 218 304.2, filed Nov. 26, 2019, pursuant to 35 U.S.C. 119(a)-(d), the content of which is incorporated herein by reference in its entirety as if fully set forth herein.

FIELD OF THE INVENTION

The invention relates to an emitter for emitting light. In particular, the invention relates to an emitter for emitting visible light, in particular white light. The invention furthermore relates to a method for emitting light by means of an emitter.

BACKGROUND OF THE INVENTION

Emitters which, with the aid of LED elements, produce ultraviolet radiation that is converted into visible light by means of a phosphor are known from the prior art. To this end, for example, the emitters comprise a coating made of the phosphor.

SUMMARY OF THE INVENTION

It is one object of the invention to improve an emitter for emitting light, and in particular to provide an emitter which has a simple structure and a high durability.

This object is achieved by an emitter for emitting light, comprising
at least one LED element for producing electromagnetic radiation in a first frequency range and
an active cooling unit for cooling the at least one LED element, having at least one cooling channel for a coolant,
wherein the at least one cooling channel is arranged at least partially in a beam path of the electromagnetic radiation produced by the at least one LED element, and
wherein the coolant comprises at least one phosphor for converting at least a part of the electromagnetic radiation into light to be emitted in a second frequency range, which is different from the first frequency range.

The emitter comprises at least one LED element for producing electromagnetic radiation in a first frequency range and an active cooling unit for cooling the at least one LED element, having at least one cooling channel for a coolant. The at least one cooling channel is arranged at least partially in a beam path of the electromagnetic radiation produced by the at least one LED element. The coolant comprises at least one phosphor for converting at least a part of the electromagnetic radiation into light to be emitted in a second frequency range, which is different from the first frequency range. According to the invention, it has been discovered that the functions of cooling the at least one LED element and of converting at least a part of the electromagnetic radiation into the light to be emitted may be combined by the coolant comprising the at least one phosphor. This leads to a simple structure of the emitter, in particular since it is not necessary to provide a separate light conversion unit and/or a separate coating.

It is furthermore advantageous that the cooling of the emitter is improved. Thus, the cooling channel which is arranged in at least a part of the beam path of the electromagnetic radiation allows direct and simple cooling of the at least one LED element. Furthermore, heat generated during the conversion of the electromagnetic radiation by means of the at least one phosphor may also be dissipated with the aid of the coolant. The at least one phosphor is advantageously cooled by the coolant. The efficiency of the emitter is increased. Functionally induced ageing of the phosphor is reduced.

A further advantage of the emitter according to the invention is that the at least one phosphor can be conveyed, particular pumped, with the remaining coolant through the active cooling unit. In this way, simpler replacement of the at least one phosphor is possible. For example, replacement of the entire coolant comprising the at least one phosphor may be carried out. Since phosphors age during the conversion of electromagnetic radiation, their durability is limited. Usually, the durability of a phosphor is substantially less than the lifetime of conventional LED elements. The lifetime of the emitter is therefore increased by the ability to replace the at least one phosphor. The emitter is reliable and durable.

The emitter comprises at least one LED element, in particular a plurality of LED elements. The at least one LED element is preferably arranged on a substrate surface of a substrate, in particular a circuit board. For example, a plurality of LED elements may be arranged at regular distances on the substrate surface. The arrangement and number of the LED elements may be varied in any desired way. The at least one LED element is, in particular, configured as an LED chip. Each LED element may comprise one or more LED chips.

The active cooling unit is used to cool the at least one LED element. The active cooling unit comprises at least one cooling channel for a coolant. The coolant comprises, for example, water and/or ethylene glycol. The coolant is conveyed, in particular pumped by a coolant pump of the active cooling unit is, in the at least one cooling channel.

The active cooling unit comprises in particular a plurality of cooling channels, preferably a network of cooling channels. The layout of the cooling channels may be adapted to arrangement of a plurality of LED elements on a substrate surface. In particular, at least one cooling channel may be provided per LED element.

The at least one phosphor is used to convert at least a part of the electromagnetic radiation into the light to be emitted. A phosphor is a substance which exhibits luminescence, in particular photoluminescence, in particular fluorescence or phosphorescence. Phosphors are also referred to as luminophores. Because of the luminescence, the at least one phosphor in the coolant converts the electromagnetic radiation in the first frequency range into the light to be emitted in the second frequency range, which is different from the first frequency range.

The first frequency range may, for example, be highly focused around a particular frequency. The second frequency range may be broader than the first frequency range.

The first frequency range of the electromagnetic radiation produced with the aid of the at least one LED element comprises, in particular, blue light and/or ultraviolet (UV) radiation. The second frequency range comprises, in particular, lower frequencies than the first frequency range. The second frequency range may be lower in energy than the first frequency range. Preferably, the second frequency range comprises visible light. For example, the second frequency range may comprise red, yellow, green and/or blue visible light. In particular, the second frequency range covers the entire visible frequency range. The second frequency range particularly preferably corresponds to white light. An emitter for emitting visible light is used for illumination, and is also referred to as a lamp or luminaire. As an alternative or in addition, the second frequency range may also comprise frequencies in the ultraviolet and/or infrared range.

All suitable phosphors may be used for the conversion of electromagnetic radiation into light to be emitted. Suitable phosphors are described, for example, in EP 1 681 728 A1. Phosphors of the aluminium garnet group, in particular of the yttrium aluminium garnet group (YAG group), are particularly suitable. Exemplary phosphors of the YAG group contain cerium (Ce) and/or praseodymium (Pr) as activators. These are in particular the phosphors $YAlO_3:Ce$, $Y_3Al_5O_{12}:Ce$, $Y_4Al_2O_9:Ce$, $(Y_{0.8}Gd_{0.2})_3Al_5O_{12}:Ce$, $Y_3(Al_{0.8}Ga_{0.2})5O_{12}:Ce$, $Tb_{2.95}Ce_{0.05}Al_5O_{12}$, $Y_{2.90}Ce_{0.05}Tb_{0.05}Al_5O_{12}$, $Y_{2.94}Ce_{0.05}Pr_{0.01}Al_5O_{12}$, and/or $Y_{2.90}Ce_{0.05}Pr_{0.05}Al_5O_{12}$.

The coolant comprising the at least one phosphor may in particular be a dispersion, in particular a suspension. The at least one phosphor is preferably in particle or powder form. The at least one phosphor may comprise powder particles which are mixed into the coolant, and which in particular form a suspension with the coolant. The at least one phosphor may, for example, be in the form of a crystalline or amorphous powder. Particularly when using a plurality of phosphors, different phosphors may be formed as powders with different particle sizes. In this way, simple distinguishing and demixing of the different phosphors is possible.

An emitter configured such that the coolant comprises at least two different phosphors, may be used flexibly and in a versatile fashion. The different phosphors may convert the electromagnetic radiation into different respective second frequency ranges. By suitable selection of different phosphors, in particular their respective concentration, the frequency distribution of the light to be emitted may therefore be adapted and/or modified in a simple way. By means of this, in particular, the hue and/or the colour temperature of the light to be emitted may be adapted. The coolant may for example comprise two, three or more different phosphors. Different phosphors may, in particular, be provided as powders with different particle sizes. This allows simple handling, and in particular simple demixing, of the different phosphors. The coolant preferably comprises two different phosphors.

An emitter comprising at least one cooling channel per phosphor, allows simple handling of different phosphors. The different phosphors may be present separately from one another in the respective cooling channel and handled separately from one another. In particular, the emitter comprises a separate cooling circuit, preferably a separate active cooling unit, per phosphor. The concentration of the respective phosphors may be adapted in a simple way independently of the other phosphors. In particular, replacement of the respective phosphors is possible independently of the further phosphors. The emitter comprises in particular a plurality of cooling channels, in particular a network of cooling channels, per phosphor. For example, the emitter may comprise at least one cooling channel per phosphor and per LED element. Particularly preferably, at least one cooling channel per phosphor is arranged at least partially in the beam path of the electromagnetic radiation of the respective LED element. The cooling channels comprising different phosphors may, for example, be arranged in alternation.

An emitter comprising at least one filter unit for demixing different phosphors and/or at least one mixing unit for mixing different phosphors in the coolant, allows simple combination and/or separation of different phosphors in the coolant. Mixing of different phosphors in the coolant by means of the mixing unit allows particularly homogeneous conversion of the electromagnetic radiation into the light to be emitted. Demixing of different phosphors by means of the filter unit allows simple handling of individual phosphors, in particular simple adaptation of the concentration and/or simple replacement of the respective phosphor.

Preferably, the emitter comprises at least one filter unit for demixing different phosphors and at least one mixing unit for mixing different phosphors in the cooling channel example, it is possible for the different phosphors to be mixed in some regions of a network of cooling channels and demixed in other regions of the network of cooling channels. This allows homogeneous conversion of the electromagnetic radiation and at the same time independent handling, in particular independent replacement of the different phosphors.

The filter unit comprises in particular an electrical, mechanical and/or chemical filter. Different phosphors may for example be filtered on the basis of their electrical, chemical or mechanical properties. For example, the different phosphors respectively have a different particle size and/or a different density. In this way, different phosphors may be mechanically distinguished and/or separated from one another in a simple way. The different substances are easy to filter, in particular demix. In particular, phosphors in particle or powder form may be mechanically demixed with the aid of different particle sizes. As an alternative or in addition, the different phosphors may also be chemically demixed.

An emitter comprising at least one testing unit for testing a concentration and/or a quality of the at least one phosphor in the coolant, is reliable. The at least one phosphor ages by conversion of the electromagnetic radiation. In other words, the phosphor is consumed. Aged phosphor only limitedly continues to allow conversion of the radiation produced by means of the at least one LED element into visible light. The quality of the at least one phosphor in this case indicates the capability of the phosphor to convert the electromagnetic radiation into the light to be emitted in the second frequency range. The measurement of the quality and/or concentration of the at least one phosphor allows prompt replacement in order to ensure reliable and consistently good conversion of the electromagnetic radiation into the light to be emitted.

The at least one testing unit may, in particular, comprise a spectrometer. For example, by means of the at least one testing unit it is possible to test whether desired conversion of the electromagnetic radiation by the at least one phosphor is being achieved. For example, electromagnetic radiation in the first frequency range may be shone onto the coolant comprising the at least one phosphor, and the spectrum of the converted light may be analysed. In particular, the spectrum of the converted light may be compared with a setpoint frequency distribution. By means of this, the quality and/or the concentration of the at least one phosphor may be characterized in a simple way.

Preferably, flow paths of the coolant comprising the at least one phosphor in the active cooling unit may be altered as a function of the result of the test. In particular, different flow paths may be set by means of valves. In particular, the valves may be controlled as a function of the result of the test.

An emitter comprising at least one phosphor reservoir for receiving phosphor from the coolant and/or for delivering phosphor to the coolant, allows simple replacement and/or simple adaptation of the concentration of the at least one phosphor in the coolant.

Preferably, the at least one phosphor reservoir is removable from the emitter, in particular replaceable. Replacement of the at least one phosphor may, for example, be carried out in such a way that aged phosphor is pumped into the phosphor reservoir. The phosphor reservoir may subsequently be removed and substituted with a phosphor reservoir comprising fresh phosphor. This may, for example, be done during maintenance work on the emitter. This ensures durability of the emitter, independently of the amount of phosphor that can be stored inside the emitter. By the ability to replace the at least one phosphor reservoir, the at least one phosphor may also be substituted with another phosphor. For example, a phosphor reservoir may be substituted with a phosphor reservoir filled with another phosphor. The adaptability of the emitter is further improved. As an alternative or in addition to the ability to replace the at least one phosphor reservoir, a plurality of phosphor reservoirs may also be provided. For example, one phosphor reservoir may be used to receive aged phosphor and a further phosphor reservoir may be used to deliver fresh phosphor to the coolant.

Advantageously, the concentration of the phosphor in the coolant may be reduced by phosphor from the coolant being received in the at least one phosphor reservoir. Likewise, the concentration of the at least one phosphor in the coolant may be increased by phosphor being delivered from the at least one phosphor reservoir to the coolant. The increase or reduction of the concentration of the at least one phosphor may be carried out together with or independently of replacement of aged phosphor. In this way, in particular, the relative concentration of different phosphors in the coolant may be modified. The conversion of the light may be adapted, in particular adapted dynamically during operation of the emitter, to a setpoint frequency distribution to be achieved for the light to be emitted. For example, a hue and/or a colour temperature of the light to be emitted may be regulated as a function of a time of day. As an alternative or in addition, a user of the emitter may specify a desired setpoint frequency distribution, in particular a desired hue and/or a desired colour temperature.

The at least one phosphor reservoir may be part of a replacement unit for replacing the at least one phosphor. The replacement unit may, for example, comprise at least one valve for selectively controlling the at least one phosphor reservoir. The phosphor replacement system may comprise at least one testing unit, in order to control the at least one phosphor reservoir as a function of a result of the test.

An emitter comprising at least one phosphor reservoir per phosphor in the coolant, is particularly flexible and versatile. The at least one phosphor reservoir per phosphor advantageously makes it possible to modify the respective concentration of the phosphor independently, and in particular to replace the respective phosphor independently of other phosphors. In this way, conversion of the electromagnetic radiation may be adapted particularly flexibly to a setpoint frequency distribution of the light to be emitted.

Preferably, at least one filter unit is arranged upstream of the different phosphor reservoirs in order to demix different phosphors. This ensures that the different phosphors are only conveyed to the respective phosphor reservoir. Particular preferably, at least one mixing unit is arranged downstream of the phosphor reservoirs in order to ensure homogeneous mixing of different phosphors in the coolant. The different phosphor reservoirs, the filter unit and/or the mixing unit may be part of a replacement unit.

An emitter configured such that at least one testing unit for testing the concentration and/or the quality of the at least one phosphor is respectively arranged upstream and downstream of the at least one phosphor reservoir, is particularly reliable. In particular, precise conversion of the electromagnetic radiation into the light to be emitted is possible. By arranging at least one testing unit both upstream and downstream of the at least one phosphor reservoir, it is possible to test both the need for and the success of replacement or adaptation of the concentration of the at least one phosphor. In particular, insufficient replacement of the at least one phosphor may, for example, be detected on the basis of a consumed stock of phosphor. The emitter may inform a user of required maintenance, in particular required changing of the at least one phosphor reservoir.

An emitter comprising a replacement circuit, which comprises the at least one phosphor reservoir and in which the coolant is guidable several times to the at least one phosphor reservoir without passing through the at least one LED element, is precise and reliable. The replacement circuit may, in particular, be formed by a replacement unit comprising the at least one phosphor reservoir and a return channel. The return channel may, in particular, return coolant from the outlet of the replacement unit to its inlet. The replacement circuit may be at least temporarily closed, preferably fluidically separable temporarily from further channels of the active cooling unit. By multiple conveying of the coolant to the at least one phosphor reservoir, without the coolant being used in the meantime for cooling, accurate iterative adaptation of the concentration and/or iterative replacement of the at least one phosphor may be carried out. In particular, the coolant is prevented from being used for conversion of the electromagnetic radiation after insufficient replacement. A deviation from the setpoint frequency distribution of the light to be emitted is reliably avoided. The emission characteristic of the light is precisely definable.

An emitter configured such that at least one cooling channel is arranged between the at least one LED element and an emission surface, through which the light to be emitted is emitted into an environment of the emitter, ensures efficient conversion of the electromagnetic radiation into the light to be emitted. Preferably, at least one cooling channel is arranged between each LED element and the emission surface. In particular, at least one cooling channel is arranged between the at least one LED element and the emission surface in the direction of a surface normal of the emission surface. The electromagnetic radiation produced with the aid of the LED element strikes the cooling channel arranged between the LED element and the emission surface before the electromagnetic radiation can emerge from the emission surface. In this way, a large part of the electromagnetic radiation produced with the aid of the at least one LED element may be converted by the at least one phosphor contained in the coolant. This increases the efficiency of the emitter. A further advantage of the at least one cooling channel arranged between the at least one LED element and the emission surface is that it can deviate, in particular scatter, the light to be emitted. For example, pleasant white light may be produced with the aid of the emitter.

The emission surface may have any desired geometry. The emission surface may, for example, be curved. The geometry of the emission surface may be adapted to a desired shape of the emitter. The emission surface is preferably planar, particularly preferably parallel to a surface of a substrate on which the at least one LED element is arranged.

An emitter configured such that the at least one cooling channel arranged between the at least one LED element and the emission surface covers the entire respective LED element as seen from the emission surface, is particularly efficient. The coverage, as seen from the emission surface, of the entire respective LED element by the at least one cooling channel arranged between the LED element and the emission surface ensures that all electromagnetic radiation emitted in the direction of the emission surface strikes the at least one cooling channel. Conversion of a particularly large fraction of the electromagnetic radiation into the light to be emitted is ensured in this way.

The at least one cooling channel may have a constant geometry, in particular a constant cross section. The at least one cooling channel preferably has an increased width in the region of the at least one LED element. The width of the cooling channel is, in particular, measured in a plane defined by the emission surface. The width of the cooling channel may be equal to or greater than the corresponding extent of the LED element. Particularly preferably, the geometry of the cooling channel is adapted to the geometry of the LED element. The at least one cooling channel preferably forms a screening surface that screens the respective LED element from the emission surface.

An emitter configured such that the at least one LED element and the at least one cooling channel are embedded in a transparent encapsulation, is stable and simple to manufacture. The transparent encapsulation protects the at least one LED element and the at least one cooling channel Damage is avoided. The encapsulation preferably comprises a silicone elastomer and/or a resin, in particular an epoxy resin. Resins, in particular epoxy resins, and/or silicone elastomers may be applied and set in a simple way. The geometry of the encapsulation, in particular the shape of the emission surface, is advantageously simply and flexibly adaptable to the respective requirements, in particular the desired shape of the emitter.

An emitter configured such that the at least one cooling channel is configured as a cavity in the encapsulation, is simple and flexible to manufacture. The geometry of the at least one cooling channel, in particular its cross section, may be established flexibly. In particular, the at least one cooling channel configured as a cavity in the encapsulation does not have an additional cooling channel housing. The heat transport takes place, in particular, directly from the at least one LED element through the encapsulation to the coolant in the cooling channel. The cooling effect is improved. Attenuation of the electromagnetic radiation at an additional cooling channel housing is avoided. The efficiency of the emitter is increased.

It is a further object of the invention to improve a method for emitting light, and in particular to make a method for emitting light efficient and reliable.

This object is achieved by a method for emitting light by means of an emitter, comprising the steps:
providing an emitter, comprising
at least one LED element for producing electromagnetic radiation in a first frequency range and
an active cooling unit for cooling the at least one LED element, having at least one cooling channel for a coolant,
wherein the at least one cooling channel is arranged at least partially in a beam path of the electromagnetic radiation produced by the at least one LED element, and
wherein the coolant comprises at least one phosphor for converting at least a part of the electromagnetic radiation into light to be emitted in a second frequency range, which is different from the first frequency range
producing electromagnetic radiation in the first frequency range by means of the at least one LED element,
cooling the at least one LED element by means of the active cooling unit and
converting at least a part of the electromagnetic radiation into the light to be emitted in the second frequency range by means of the at least one phosphor.

First, the emitter according to the invention is provided. The emitter provided may, in particular, have some or several of the optional features described above in connection with the emitter. By means of the at least one LED element, electromagnetic radiation is produced in a first frequency range. The at least one LED element is cooled by means of the active cooling unit. At least a part of the electromagnetic radiation is converted by means of the at least one phosphor into the light to be emitted in the second frequency range. The advantages of the method correspond to the advantages of the emitter described above.

A method configured such that a concentration and/or a quality of the at least one phosphor in the coolant are measured, is particularly reliable. A spectrum of the electromagnetic radiation converted into the light to be emitted is preferably measured. Deviations from a desired emission characteristic, in particular a setpoint frequency distribution of the light to be emitted, can be detected in a simple way.

A method configured such that the at least one phosphor is at least partially replaced, allows a particularly long lifetime of the emitter. The at least partial replacement of the phosphor allows operation of the emitter even beyond the durability of the phosphor. The replacement of the at least one phosphor may be carried out with the aid of at least one phosphor reservoir, as described above with reference to the emitter.

A method configured such that the coolant comprises at least two different phosphors, is particularly flexible. By the use of at least two different phosphors, it is possible to improve an emission characteristic, in particular a setpoint frequency distribution of the light to be emitted.

A method configured such that the respective concentrations of the phosphors are adapted to a setpoint frequency distribution for the light to be emitted, is particularly flexible and versatile. The adaptation of the respective concentrations of the phosphors to a setpoint frequency distribution may in particular be carried out using one or more phosphor reservoirs, in particular using at least one phosphor reservoir per phosphor. Preferably, the setpoint frequency distribution may be adapted to a desired hue and/or a desired colour temperature. The adaptation may be carried out automatically, for example as a function of the time of day and/or position of the sun. As an alternative or in addition, the adaptation may be carried out according to preferences and/or specifications of a user.

A method configured such that the different phosphors are conveyed in respectively different cooling channels, allows particularly simple handling of different phosphors. The different phosphors are preferably conveyed in different coolant circuits, particularly in different cooling units. Strict separation of the different phosphors allows, in particular, simple adaptation of the concentration and/or simple replacement of the respective phosphor independently of the further phosphors.

A method configured such that different phosphors are mixed and/or demixed in the coolant, is flexible. The mixing of the phosphors in the coolant, in particular by a mixing unit, ensures homogeneous mixing of different phosphors in the coolant. Demixing of different phosphors in the coolant allows separate adaptation of the concentrations and/or the ability to replace the respective phosphors separately.

Further features, advantages and details of the invention may be found from the following description of several exemplary embodiments.

DESCRIPTION OF THE PREFERRED EMBODIMENTS

Figure 1:
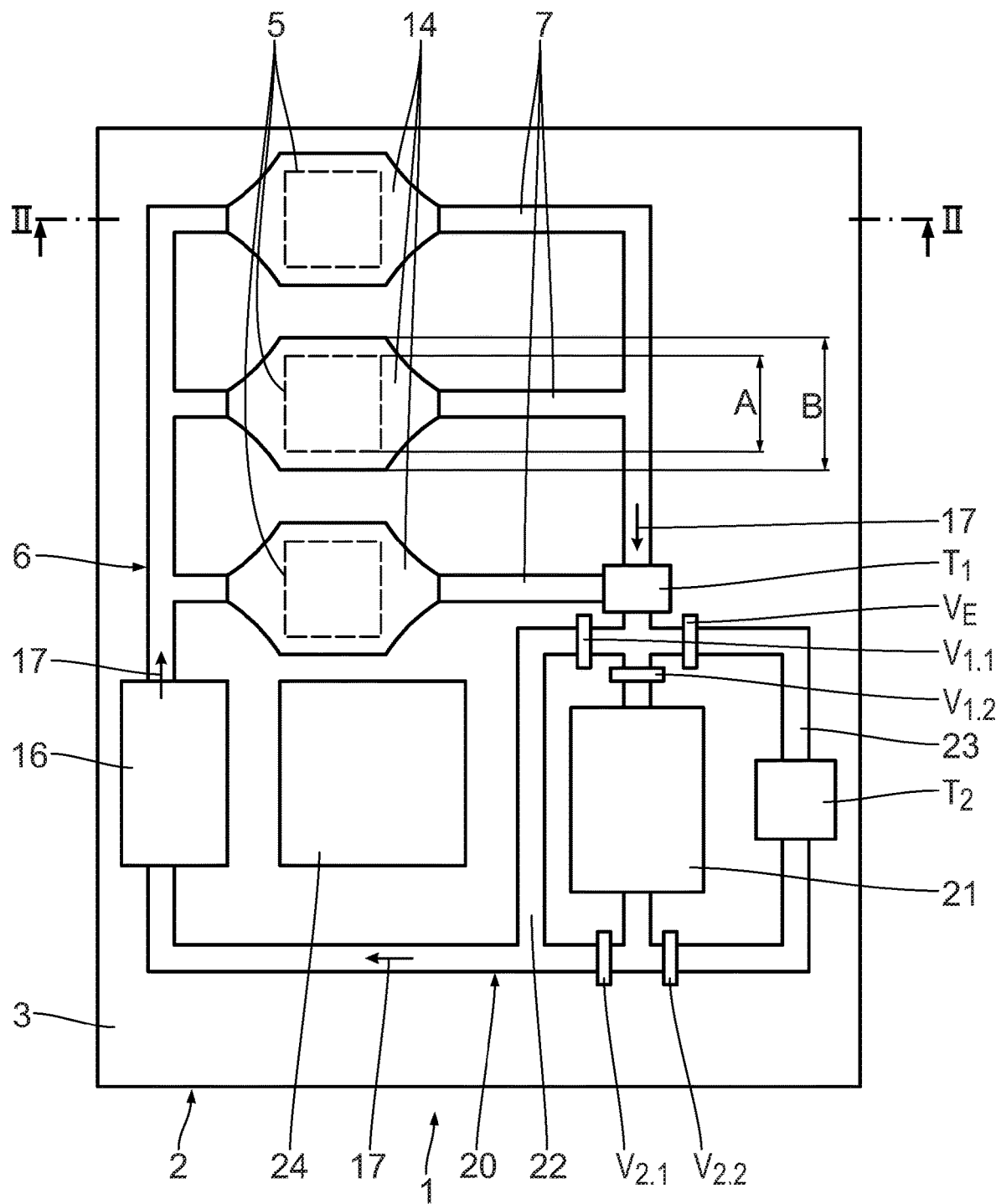
FIG. 1 shows a plan view of a schematically represented first exemplary embodiment of an emitter in the form of a lamp with a plurality of LED elements and an active cooling unit.

A first exemplary embodiment of an emitter in the form of a lamp 1 will be explained with the aid of FIGS. 1 to 3. The lamp 1 comprises a substrate 2. The substrate 2 is a circuit board. The substrate 2 has a first substrate surface 3 and a second substrate surface 4 separated from the first substrate surface 3 by a substrate thickness. A multiplicity of LED elements 5 is arranged on the first substrate surface 3. The lamp 1 furthermore comprises an active cooling unit 6 having a network of cooling channels 7.

The exemplary embodiment represented in FIG. 1 comprises by way of example three LED elements 5. The LED elements 5 are arranged in a row on the first substrate surface 3. The number and arrangement of the LED elements 5 are not essential, and may vary depending on the exemplary embodiment.

The LED elements 5 are respectively configured as an LED chip. The LED elements 5 are conductively connected to the substrate 2 with the aid of a first electrode 8 and a second electrode 9 and a bond wire 10.

The LED elements 5 are used to produce electromagnetic radiation S. The electromagnetic radiation S has a frequency in a first frequency range. In FIG. 2, the electromagnetic radiation S produced by means of the LED elements 5 is symbolically represented by an arrow. As will be explained in more detail below, the radiation S is converted into the light L to be emitted by means of the lamp 1, the light L to be emitted having frequencies in a second frequency range, which is different from the first frequency range. The light L to be emitted is symbolically represented in FIG. 2 by a curved arrow.

The cooling channels 7 are used to cool the LED elements 5. In the exemplary embodiment shown, one cooling channel 7 per LED element 5 is arranged on the side of the first substrate surface 3. The cooling channels 7 are arranged on the same side of the substrate 2 as the LED elements 5. This ensures direct and efficient cooling of the LED elements 5.

The LED elements 5 and the cooling channels 7 are embedded in a transparent encapsulation 11. The cooling channels 7 are configured as a cavity in the encapsulation 11. The cooling channels 7 therefore do not have a further cooling channel housing. This facilitates manufacture of the cooling channels 7. The geometry of the cooling channels 7, in particular their cross section, may be established flexibly and simply. A region of the encapsulation 11 on a side of the cooling channel 7 facing away from the LED element 5 furthermore has the function of a cooling surface, through which heat may be released from the cooling channel 7 to an environment of the lamp 1.

Suitable materials for the transparent encapsulation 11 are for example resins, in particular epoxy resins, and/or silicone elastomers. These materials may be applied and set in a simple way. The shape of the encapsulation may therefore advantageously be adapted simply and flexibly to the respective requirements, in particular the desired shape. For example, the epoxy resin sold under the brand name "Nitto Denko NT-8524" is used as encapsulation. One exemplary silicone elastomer is the one sold under the brand name "Dow Corning OE-6550".

The encapsulation 11 defines an emission surface 12 lying opposite in relation to the LED elements 5 of the first substrate surface 3. The light L to be emitted by the lamp 1 is emitted through the emission surface 12 into an environment of the lamp 1. In the exemplary embodiment shown, the emission surface 12 is configured to be planar and parallel to the first substrate surface 3. In other exemplary embodiments (not shown), the emission surface may also have a different relative position with respect to the first substrate surface and/or a different shape, for example a curvature.

One cooling channel 7 is provided per LED element 5. The respective cooling channel 7 is arranged between the LED light element 5 and the emission surface 12. As seen from the emission surface 12, the cooling channel 7 covers the entire respective LED element 5. For this reason, the LED elements 5 are only represented by dashes in FIG. 1, which shows a plan view of the lamp 1 as seen from the emission surface 12. This symbolises that the LED elements 5 lie below the respective cooling channels 7 in the plan view shown in FIG. 1. In other exemplary embodiments, a cooling channel may also cover a plurality of LED elements, for example a plurality of LED elements lying in a row.

The cooling channel 7 is arranged between the respective LED element 5 and the emission surface 12 in the direction of a surface normal 13 of the emission surface 12. The cooling channel 7 covers the entire respective LED element 5 in a plane defined by the emission surface 12. The cooling channels 7 form a screening surface 14 in the region of the LED elements 5. In the region of the screening surface 14, the cooling channels 7 have a width B measured in a plane defined by the emission surface 12. The width B of the cooling channels 7 in the region of the screening surface 7 is greater than a corresponding extent A of the LED elements 5. In general, the geometry of the screening surface 14 of the cooling channels may be adapted to the geometry, in particular the size, of the respective LED elements 5.

In order to cool the LED elements 5, the cooling channels 7 contain a coolant 15. The active cooling unit 6 comprises a coolant pump 16, with which the coolant 15 is pumped in the direction of the arrows 17. The active cooling unit 6 therefore forms a coolant circuit. Various fluids, in particular liquids, may be used as the coolant 15. The coolant 15 may, for example, comprise ethylene glycol and/or water.

Figure 2:
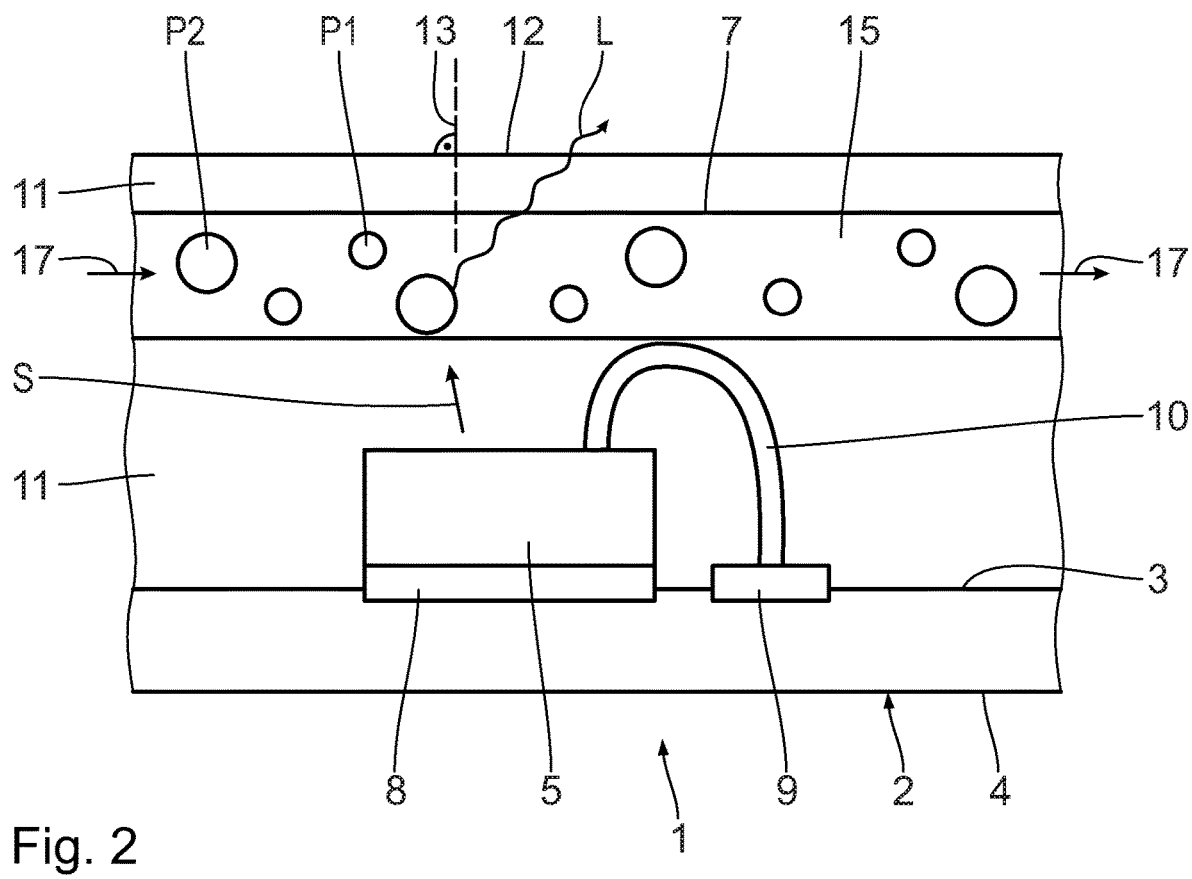
FIG. 2 shows a cross section through the lamp according to FIG. 1 along the section line II-II.
Figure 3:
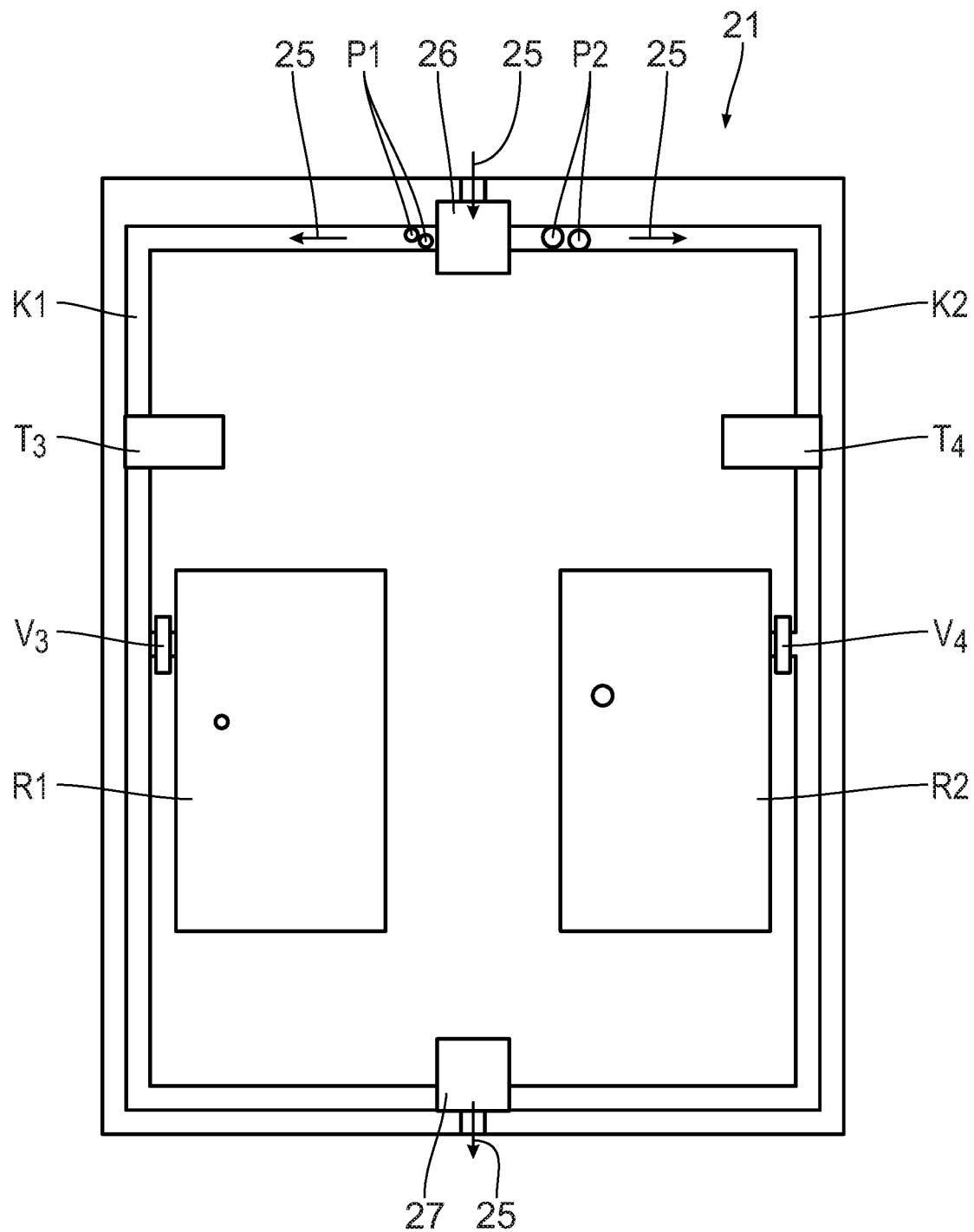
FIG. 3 shows a phosphor replacement unit of the lamp according to FIG. 1.

The coolant 15 contains two different phosphors P1, P2, which are symbolically represented in FIGS. 2 and 3 by circles of different sizes. The phosphors P1, P2 are pumped with the coolant 15 through the cooling channels 7. The phosphors P1, P2 convert the electromagnetic radiation S in the first frequency range, generated by means of the LED elements 5, into the light L to be emitted in the second frequency range. Such phosphors are also referred to as luminophores.

With the aid of the LED elements 5, electromagnetic radiation S is produced with frequencies in a first frequency range. In the exemplary embodiment represented, the first frequency range comprises blue light and/or ultraviolet radiation. By the phosphors P1, P2, the electromagnetic radiation S is converted into visible light L. The light L to be emitted therefore has a second frequency range, the frequencies of which are lower than the frequencies of the first frequency range of the electromagnetic radiation S. The second frequency range covers the entire visible range. The emitted light L is white light. Suitable phosphors P1, P2 are, for example, phosphors of the aluminium garnet group, in particular of the yttrium aluminium garnet group (YAG group). Exemplary phosphors of the YAG group contain cerium (Ce) and/or praseodymium (Pr) as activators.

In the exemplary embodiment represented, the phosphors P1, P2 are crystalline powders which form a suspension with the coolant 15. The phosphors P1, P2 have different particle sizes, which are schematically represented in the figures by a different size of the circles symbolising the phosphors. Because of the different particle size, the phosphors P1, P2 can be distinguished and demixed in a simple way.

Since the coolant 15 comprises the phosphors P1, P2, both cooling of the LED elements 5 and conversion of the electromagnetic radiation S may be carried out by using it. The combination of these two functions allows a simple structure of the lamp 1. Furthermore, heat generated during the conversion of the electromagnetic radiation S may be dissipated directly through the coolant 15. A further advantage is that the phosphors P1, P2 are pumped around with the coolant 15. Phosphors P1, P2 consumed by conversion of the electromagnetic radiation S into the light L to be emitted may be replaced and substituted in a simple way. This increases the durability of the lamp 1.

A further advantage of the lamp 1 is that the screening surfaces 14 of the cooling channels 7 fully cover the respective LED element as seen from the emission surface 12. The electromagnetic radiation S produced by means of the LED elements 5 cannot reach the emission surface directly, but must pass through the screening surface 14 and therefore the coolant 15 comprising the phosphors P1, P2. The efficiency of the conversion of the electromagnetic radiation S into the emitted light L is improved.

For the conversion of the electromagnetic radiation S produced by means of the LED elements 5 into the light L to be emitted, it is sufficient for the coolant 15 to contain at least one phosphor. In the exemplary embodiment shown, the coolant 15 contains two different phosphors P1, P2. The use of different phosphors P1, P2 has the advantage that the conversion of the electromagnetic radiation S can be adapted to a desired characteristic of the light L to be emitted. In particular, a setpoint frequency distribution of the light L to be emitted may be adjusted by the selection of suitable phosphors P1, P2 and/or of their respective concentrations in the coolant 15. In this way, in particular, the colour and/or the colour temperature of the light L to be emitted may be adapted.

Because of the conversion of the electromagnetic radiation S into the light L to be emitted, the phosphors P1, P2 age, i.e. their quality decreases. With a decreasing quality of the phosphors P1, P2, reliable conversion of the electromagnetic radiation S can no longer be ensured. In particular, replacement of at least one of the two phosphors P1, P2 in the coolant 15 is necessary in such a case.

Replacement and/or adaptation of the respective concentrations of the phosphors P1, P2 in the coolant 15 will be described below. The lamp 1 comprises a phosphor replacement system 20. The phosphor replacement system 20 comprises a replacement unit 21. The replacement unit 21 is shown in detail in FIG. 3. The phosphor replacement system 20 comprises a bypass channel 22 bypassing the replacement unit 21 and a return channel 23 connecting the outlet side of the replacement unit 21 to its inlet side.

The phosphor replacement system 20 comprises a multiplicity of testing units $T_i$, with i=1, 2, 3, 4. The testing unit $T_1$ is arranged upstream of the replacement unit 21 before a fork of the flow paths into the bypass channel 22, the replacement unit 21 and the return channel 23. The coolant 15 flowing from the cooling channels 7 to the phosphor replacement system 20 passes through the testing unit $T_1$. The testing unit $T_2$ is arranged in the return channel 23. The testing units $T_3$, $T_4$ are part of the replacement unit 21 and will be described in more detail below.

The testing units $T_i$ are used to measure the quality and/or concentration of the phosphors P1, P2 in the coolant 15. The testing units $T_i$ comprise spectrometers. Electromagnetic radiation in the first frequency range is produced and shone onto the coolant comprising the phosphors P1, P2. The spectrometers of the testing units $T_i$ then determine a spectrum of the electromagnetic radiation converted by means of the phosphors P1, P2. The spectrum determined is compared with a setpoint frequency distribution of the light L to be emitted. By comparing the spectrum determined with the setpoint frequency distribution, it is possible to determine the extent to which the quality and/or the concentration of the respective phosphors P1, P2 correspond to predetermined setpoint values.

The setpoint frequency distribution may be rigidly predetermined. As an alternative, the setpoint frequency distribution may vary, and may in particular vary as a function of the time of day. The setpoint frequency distribution may also be adaptable by a user. In this way, in particular, the colour and/or the colour temperature of the light L to be emitted by means of the lamp 1 may be adapted flexibly.

The phosphor replacement system 20 furthermore comprises a multiplicity of valves $V_j$, j being 1.1, 1.2, 2.1, 2.2, 3 or 4. The valves $V_{1.1}$ and $V_{1.2}$ are arranged upstream of the replacement unit 21. The valve $V_{1.1}$ is used to close or open the bypass channel 22. The valve $V_{1.2}$ is arranged at the inlet of the replacement unit 21 and makes it possible to open and close this inlet. The valves $V_{2.1}$ and $V_{2.2}$ are arranged downstream of the replacement unit 21. The valve $V_{2.1}$ regulates a liquid flow from the replacement unit 21 to the coolant pump 16. The valve $V_{2.2}$ regulates a liquid flow from the replacement unit 21 into the return channel 23. The valves $V_3$ and $V_4$ are part of the replacement unit 21 and will be described in more detail below. A one-way valve $V_E$ that defines a flow direction in the return channel 23 is furthermore arranged in the return channel 23. The one-way valve $V_E$ prevents the coolant 15 from flowing from an inlet side of the replacement unit 21 to an outlet side of the replacement unit 21 through the return channel 23. The one-way valve $V_E$ may, for example, be configured as a nonreturn valve.

The phosphor replacement system 20 comprises a microcontroller 24. The microcontroller 24 regulates the replacement and/or the adaptation of the concentrations of the phosphors P1, P2 in the coolant 15. The microcontroller 24 is connected via the circuit board forming the substrate 2 to the testing units $T_i$ and the valves $V_j$ in such a way as to transmit signals and data. The microcontroller 24 evaluates the results of the tests by means of the testing units $T_i$ and controls the valves $V_j$ correspondingly, as will be described below.

Independently of whether the individual valves $V_j$ are open or closed, the coolant 15 comprising the phosphors P1, P2 flows through the testing unit $T_1$. As long as the test by means of the testing unit 1 shows that the quality and/or the concentration of the phosphors P1, P2 corresponds to the respective setpoint values, the lamp 1 is operated in a normal operating mode.

In the normal operating mode, the valves $V_{1.2}$, $V_{2.1}$ and $V_{2.2}$ are closed. The valve $V_{1.1}$ is open. The coolant 15 comprising the phosphors P1, P2 flows from the cooling channels 7 through the bypass channel 22 directly to the coolant pump 16, and is pumped by the latter into the cooling channels 7. In the normal operating mode, flow does not take place through the replacement unit 21. Replacement and/or adaptation of the concentrations of the phosphors P1, P2 does not take place. Because of the one-way valve $V_E$, the coolant 15 does not flow through the return channel 23 in the normal operating mode.

If the testing unit $T_1$ establishes deviations in the quality and/or concentration of the respective phosphors P1, P2 in the coolant from the setpoint values, the microcontroller 24 initiates a corresponding replacement process. At the start of the replacement process, the valve $V_{1.1}$ is closed and the valve $V_{1.2}$ is opened. The valve $V_{2.1}$ remains closed. The valve $V_{2.2}$ is opened. The coolant 15 comprising the phosphors P1, P2 now flows through the replacement unit 21. With the aid of the replacement unit 21, replacement and/or adaptation of the concentration of one or both of the phosphors P1, P2 in the coolant is carried out.

The coolant 15 flowing out of the replacement unit 21 is not directly sent to the coolant pump 16 and used to cool the LED elements 5. Instead, the coolant 15 flows from the replacement unit 21 through the return channel 23 back to the inlet of the replacement unit. In the return channel 23, the coolant flows through the testing unit $T_2$. The quality and/or the concentration of the respective phosphors P1, P2 in the coolant is again tested by the testing unit $T_2$. If the test by means of the testing unit $T_2$ reveals that there are no longer any deviations from the setpoint values, the valve $V_{2.2}$ is closed and the valve $V_{2.1}$ is opened. After replacement and/or adaptation of the concentration of one both of the phosphors P1, P2, the coolant then flows from the replacement unit 21 back to the coolant pump 16 and is used to cool the LED elements 5.

If the test by means of the testing unit $T_2$ reveals there are still deviations in the quality and/or the concentrations of the phosphors P1, P2 in the coolant 15 from the setpoint values, further adaptation and/or further replacement of at least one of the phosphors P1, P2 may be carried out by flowing through the replacement unit 21 again. The replacement unit 21 and the return channel 23 form a closed replacement circuit, in which the coolant 15 flows through the replacement unit 21 several times in order to bring about a stepwise adaptation of the quality and/or concentrations of the phosphors P1, P2 in the coolant.

If the test by means of the testing unit $T_1$ shows that the coolant 15 flowing from the cooling channels 7 to the phosphor replacement system 20 satisfies the setpoint values for quality and/or concentration of the phosphors P1, P2, the replacement process is ended. To this end, the valves $V_{1.2}$, $V_{2.1}$, $V_{2.2}$ are closed and the valve $V_{1.1}$ is opened. The microcontroller 24 switches back to the normal operating mode.

The replacement unit 21 will be described in detail below with reference to FIG. 3. The coolant 15 flows through the replacement unit 21 in the direction of the arrows 25.

The replacement unit 21 comprises a filter unit 26 on the inlet side and a mixing unit 27 on the outlet side. The filter unit 26 demixes the different phosphors P1, P2. The filter unit 26 leads to separation of the different phosphors P1, P2. In the exemplary embodiment represented, the filter unit 26 demixes the phosphors P1, P2 mechanically with the aid of the different particle sizes of the phosphors P1, P2. Downstream of the filter unit 26, the replacement unit 21 comprises two separate channel systems K1, K2 for the respective phosphors P1, P2. The channel systems K1, K2 are connected on the outlet side by means of the mixing unit 27. The mixing unit 27 mixes the phosphors P1, P2 in the coolant 15 which are conveyed in the respective channel systems K1, K2.

The testing unit $T_3$ is arranged in the channel systems K1 for the phosphor P1. The testing unit $T_3$ tests the quality and/or concentration of the phosphor P1 in the coolant 15 independently of the phosphor P2. The replacement unit comprises a phosphor reservoir R1 for the phosphor P1. The phosphor reservoir R1 is connected via the valve $V_3$ to the channel system K1. The phosphor reservoir R1 is used to receive the phosphor P1 from the coolant 15 and/or to deliver the phosphor P1 to the coolant 15. In this way, the concentration of the phosphor P1 in the coolant 15 can be adapted. The phosphor reservoir R1 may also remove consumed phosphor P1 from the coolant 15 and substitute it with fresh phosphor P1. The valve $V_3$ is controlled as a function of the testing by means of the testing unit $T_3$ in order to bring about corresponding replacement of the phosphor P1 with the aid of the phosphor reservoir R1.

The channel system K2 for the coolant 15 containing the phosphor P2 is configured in an equivalent way to the channel system K1. It comprises the testing unit $T_4$, which makes it possible to test the quality and/or concentration of the phosphor P2 independently of the phosphor P1. The replacement unit comprises a phosphor reservoir R2 for the replacement of the phosphor P2. The phosphor reservoir R2 is connected via the valve $V_4$ to the channel system K2.

With the aid of the mixing unit 27, the phosphors P1, P2 are mixed again on the output side. The coolant flowing from the replacement unit 21 comprises a homogeneous mixture of the phosphors P1, P2 with the respective concentrations.

If fresh phosphor P1, P2 is no longer contained in one both of the phosphor reservoirs R1, R2, it is possible to change the corresponding phosphor reservoir R1, R2 and therefore carry out more extensive, in particular complete replacement of the respective phosphor P1, P2. To this end, consumed phosphor P1, P2 is pumped into the respective reservoir R1, R2. After closing the valves $V_3$ or $V_4$, respectively, the respective phosphor reservoir R1, R2 may be removed and substituted with a new phosphor reservoir R1, R2 comprising fresh phosphor P1, P2. After opening the valves $V_3$ or $V_4$, respectively, the fresh respective phosphor P1, P2 is then introduced into the coolant 15. Such complete replacement further extends the durability of the lamp 1. The replacement may, in particular, be carried out during maintenance of the lamp 1. When changing one both of the phosphor reservoirs R1, R2, the respective phosphor P1, P2 may also be substituted with a different phosphor. In this way, even better adaptability of the conversion of the electromagnetic radiation is possible.

In further exemplary embodiments (not represented), the lamp comprises a plurality of phosphor reservoirs per phosphor. One of the phosphor reservoirs is used to receive aged phosphor, whereas a further of the phosphor reservoirs holds fresh phosphor ready for the replacement. Maintenance of the lamp, in particular replacement of the phosphor reservoirs, is only necessary after a longer period of operation. The maintenance interval is extended.

Figure 4:
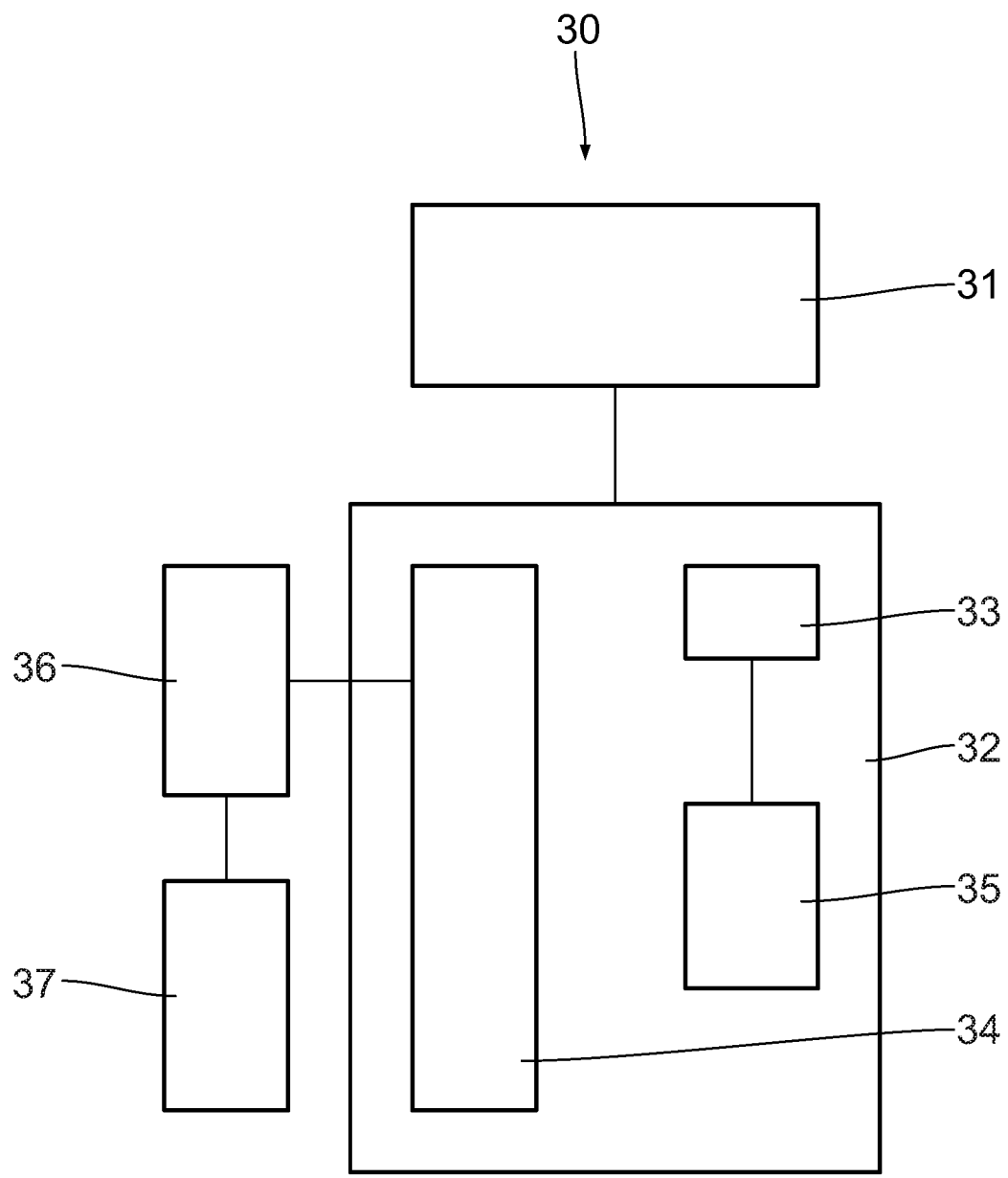
FIG. 4 shows a schematic method sequence of an operating method for the lamp according to FIG. 1.

FIG. 4 schematically represents the sequence of an operating method 30 for the lamp 1. In a provision step 31, the lamp 1 is provided. The provision step 31 is followed by an emission step 32. In the emission step 32, light is emitted with the aid of the lamp 1. To this end, electromagnetic radiation in a first frequency range is produced by means of the LED elements 5 in a radiation production step 33. In a cooling step 34, the LED elements 5 are cooled with the aid of the active cooling unit 6.

In the conversion step 35, the electromagnetic radiation S produced with the aid of the LED elements 5 is converted with the aid of the phosphors P1, P2 in the coolant 15 into the light L to be emitted. The light L to be emitted is emitted by the lamp 1 through the emission surface 12.

In parallel with the cooling step, a testing step 36 is carried out, in which a concentration and/or a quality of the phosphors P1, P2 in the coolant 15 is measured. As a function of the result of the testing step 36, a replacement step 37 is carried out, in which at least partial replacement of one of the phosphors P1, P2 in the coolant 15 takes place. The replacement step 37 may also be used to adapt the concentration of at least one of the phosphors P1, P2 in the coolant.

Figure 5:
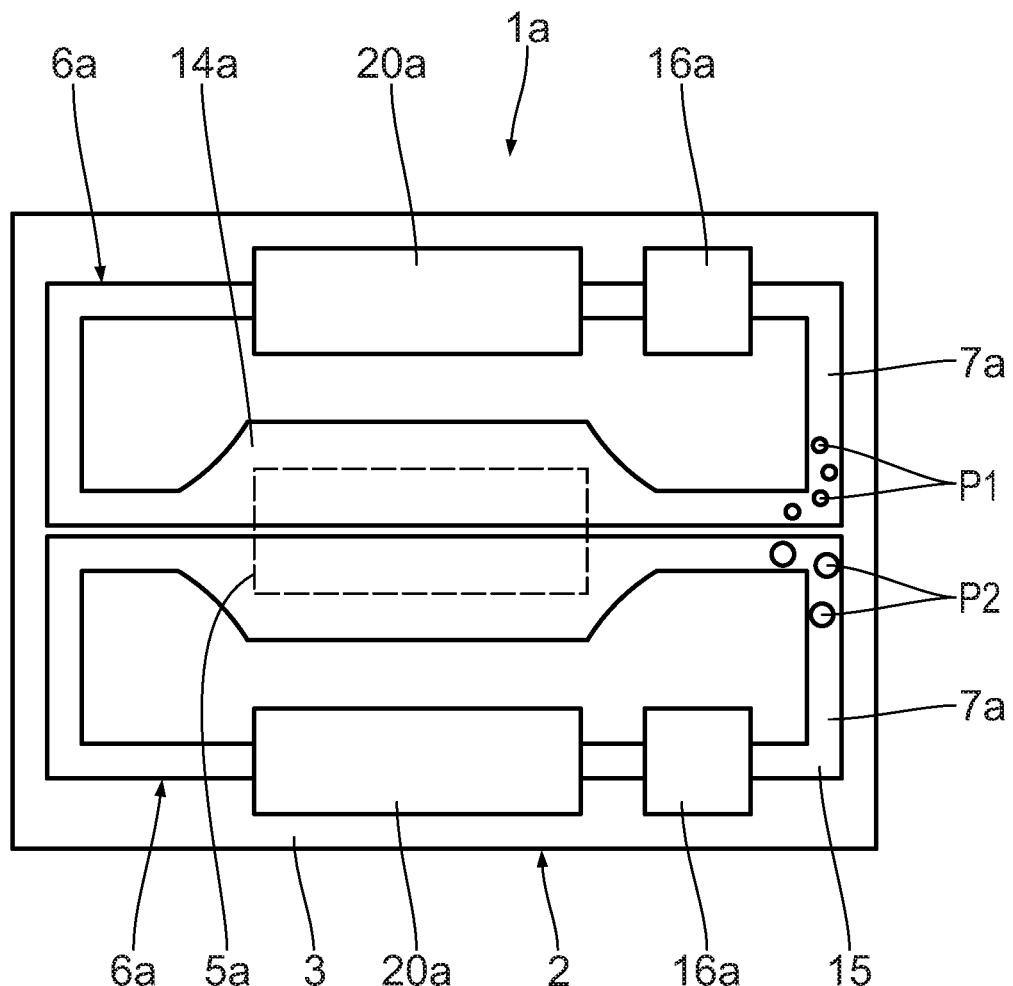
FIG. 5 shows a schematic plan view of a second exemplary embodiment of a lamp.

FIG. 5 schematically represents a further exemplary embodiment of a lamp 1a. Components which have already been described in connection with the exemplary embodiment in FIGS. 1 to 3 bear the same references. Components which are different in design but functionally equivalent bear the references with a suffixed a.

For the lamp 1a, only one LED element 5a is shown by way of example. The light 1a differs from the exemplary embodiment in FIGS. 1 to 3 primarily in that two separate active cooling units 6a are provided. The two cooling units 6a respectively comprise cooling channels 7a, through which a coolant 15 is respectively pumped with the aid of a coolant pump 16a. The coolant 15 in the respective cooling channels 7a of the cooling units 6a respectively comprises a phosphor. In one of the cooling units 6a, the coolant 15 comprises the phosphor P1, whereas the coolant of the other cooling unit 6a comprises the phosphor P2. The phosphors P1, P2 are again symbolised by circles of different sizes. The lamp 1a respectively comprises an active cooling unit 6a with a cooling channel 7a respectively for one of the different phosphors P1, P2. The two cooling units 6a form separate cooling circuits. In the region of the LED light element 5a, the respective cooling channels 7a form a common screening surface 14a. The screening surface 14a comprises regions of the different cooling circuits, in which the different phosphors P1, P2 are contained in the coolant 15.

In the lamp 1a, the phosphors P1, P2 are present separately in the respective cooling units 6a. Separate cooling circuits for the coolant 15 comprising the respective phosphor P1, P2 are formed by the respective cooling units 6a. The two active cooling units 6a respectively comprise a phosphor replacement system 20a. The respective phosphor replacement systems 20a of the lamp 1a may be configured in substantially the same way as the phosphor replacement system 20 of the lamp 1 according to FIGS. 1 to 3, with the difference that the phosphor replacement systems 20a are only configured for the replacement of a single phosphor. To this end, a replacement unit of the phosphor replacement systems 20a may be configured without a filter unit and a corresponding mixing unit. Such a replacement unit comprises only one channel system with a single phosphor reservoir for the phosphor contained in the respective cooling unit 6a.

What is claimed is:

1. An emitter for emitting light, the emitter comprising:
at least one LED element for producing electromagnetic radiation in a first frequency range;
an active cooling unit for cooling the at least one LED element, having at least one cooling channel for a coolant, wherein the at least one cooling channel is arranged at least partially in a beam path of the electromagnetic radiation produced by the at least one LED element, wherein the coolant comprises at least one phosphor for converting at least a part of the electromagnetic radiation into light to be emitted in a second frequency range, which is different from the first frequency range, the coolant comprising at least two different phosphors; and
at least one phosphor reservoir per phosphor in the coolant for at least one of receiving phosphor from the coolant and for delivering phosphor to the coolant.

2. The emitter according to claim 1, further comprising:
at least one cooling channel per phosphor.

3. The emitter according to claim 1, further comprising at least one of:
at least one filter unit for demixing different phosphors; and
at least one mixing unit for mixing different phosphors in the coolant.

4. The emitter according to claim 1, further comprising:
at least one testing unit for testing at least one of a concentration and a quality of the at least one phosphor in the coolant.

5. The emitter according to claim 1, wherein at least one testing unit for testing at least one of the concentration and the quality of the at least one phosphor is respectively arranged upstream and downstream of the at least one phosphor reservoir.

6. The emitter according to claim 1, further comprising:
a replacement circuit, which comprises the at least one phosphor reservoir and in which the coolant is guidable several times to the at least one phosphor reservoir without passing through the at least one LED element.

7. The emitter according to claim 1, wherein at least one cooling channel is arranged between the at least one LED element and an emission surface, through which the light to be emitted is emitted into an environment of the emitter.

8. The emitter according to claim 7, wherein the at least one cooling channel arranged between the at least one LED element and the emission surface covers the entire respective LED element as seen from the emission surface.

9. The emitter according to claim 1, wherein the at least one LED element and the at least one cooling channel are embedded in a transparent encapsulation.

10. The emitter according to claim 9, wherein the at least one cooling channel is configured as a cavity in the encapsulation.

11. A method for emitting light by means of an emitter, the method comprising the steps:

providing an emitter, the emitter comprising at least one LED element for producing electromagnetic radiation in a first frequency range and the emitter further comprising an active cooling unit for cooling the at least one LED element, having at least one cooling channel for a coolant, the coolant comprising at least two different phosphors, wherein the at least one cooling channel is arranged at least partially in a beam path of the electromagnetic radiation produced by the at least one LED element, wherein the coolant comprises at least one phosphor for converting at least a part of the electromagnetic radiation into light to be emitted in a second frequency range, which is different from the first frequency range, the emitter further comprising at least one phosphor reservoir per phosphor in the coolant for at least one of receiving phosphor from the coolant and for delivering phosphor to the coolant;

producing electromagnetic radiation in the first frequency range by means of the at least one LED element;

cooling the at least one LED element by means of the active cooling unit; and converting at least a part of the electromagnetic radiation into the light to be emitted in the second frequency range by means of the at least one phosphor.

12. The method according to claim 11, wherein at least one of a concentration and a quality of the at least one phosphor in the coolant are measured.

13. The method according to claim 11, wherein the at least one phosphor is at least partially replaced.

14. The method according to claim 12, wherein the respective concentrations of the phosphors are adapted to a setpoint frequency distribution for the light to be emitted.

15. The method according to claim 12, wherein the different phosphors are conveyed in respectively different cooling channels.

16. The method according to claim 12, wherein different phosphors are at least one of mixed and demixed in the coolant.

\* \* \* \* \*